(12) United States Patent
Soman

(10) Patent No.: US 8,787,964 B2
(45) Date of Patent: *Jul. 22, 2014

(54) INTEGRATED RADIO FREQUENCY FRONT-END CIRCUIT

(75) Inventor: Manoj Shridhar Soman, Pune (IN)

(73) Assignee: Mindtree Limited, Bangalore, Karnataka (IN)

( * ) Notice: Subject to any disclaimer, the term of this patent is extended or adjusted under 35 U.S.C. 154(b) by 335 days.

This patent is subject to a terminal disclaimer.

(21) Appl. No.: 12/875,131

(22) Filed: Sep. 3, 2010

(65) Prior Publication Data

US 2011/0319042 A1 Dec. 29, 2011

(30) Foreign Application Priority Data

Jun. 23, 2010 (IN) .......................... 1752/CHE/2010

(51) Int. Cl.
*H04B 1/18* (2006.01)
*H04B 7/00* (2006.01)

(52) U.S. Cl.
USPC ........ 455/550.1; 455/78; 455/279.1; 455/292

(58) Field of Classification Search
USPC .................. 455/78–83, 550.1, 279.1, 292
See application file for complete search history.

(56) References Cited

U.S. PATENT DOCUMENTS

| | | | |
|---|---|---|---|
| 6,327,309 B1 * | 12/2001 | Dreyer et al. ................. | 375/258 |
| 6,809,581 B2 | 10/2004 | Rofougaran | |
| 7,209,727 B2 * | 4/2007 | Castaneda et al. ............ | 455/341 |
| 7,626,472 B2 * | 12/2009 | Davies-Venn et al. .......... | 333/26 |
| 7,787,830 B2 * | 8/2010 | Goddard et al. ................. | 455/78 |
| 7,899,409 B2 * | 3/2011 | Huang et al. .................... | 455/78 |
| 8,099,062 B1 * | 1/2012 | Terrovitis ......................... | 455/84 |
| 2004/0207504 A1 * | 10/2004 | Yang et al. ...................... | 336/223 |
| 2006/0119478 A1 * | 6/2006 | Karam et al. ................... | 340/538 |
| 2009/0051440 A1 | 2/2009 | Kim | |
| 2009/0251221 A1 | 10/2009 | Gorbachov | |
| 2009/0275295 A1 * | 11/2009 | Roufoogaran .................. | 455/78 |
| 2009/0289721 A1 * | 11/2009 | Rajendran et al. ............ | 330/301 |
| 2012/0013417 A1 * | 1/2012 | Soman ............................ | 333/25 |

OTHER PUBLICATIONS

Bhatti, I. Roufoogaran, R. Castaneda, J., A fully integrated transformer-based front-end architecture for wireless transceivers, Solid-State Circuits Conference, 2005. Digest of Technical Papers. ISSCC. 2005 IEEE International, Feb. 10, 2005, pp. 106-587, vol. 1, ISSN: 0193-6530, Print ISBN: 0-7803-8904-2, San Francisco, CA, USA.

(Continued)

*Primary Examiner* — Simon Nguyen
(74) *Attorney, Agent, or Firm* — Ash Tankha; Lioton, Weinberger & Husick

(57) ABSTRACT

An integrated RF front-end circuit comprising a balun, a receiver amplifier, a power amplifier, and a selector circuit is provided. The balun comprises a center-tapped inductor having a first node, a center-tap switchlessly coupled to a fixed voltage, and a second node. The balun receives a single-ended signal through the first node to produce a differential signal at the first and second nodes. The differential signal is provided to balanced input lines of the receiver amplifier. Balanced output lines of the power amplifier provide a differential signal to the first and second nodes. The balun converts the differential signal to a single-ended signal. The single-ended signal is available at the first node of the center-tapped inductor. The selector circuit activates the receiver amplifier and deactivates the power amplifier, and vice versa. The power amplifier may comprise only a single-ended output line connected to either the first or the second node.

37 Claims, 8 Drawing Sheets

(56) References Cited

OTHER PUBLICATIONS

B. Marholev at el., A Single-Chip Bluetooth EDR Device in 0.13 µm CMOS, Solid-State Circuits Conference, 2007. ISSCC 2007. Digest of Technical Papers. IEEE International, Feb. 11-15, 2007, pp. 556-557, Issue No. 0193-6530, Publisher: IEEE, San Francisco, CA, USA.

William W. Si at el., A Single-Chip CMOS Bluetooth v2.1 Radio SoC, Publication:IEEE JSSC Dec. 2008.

Vincent Knopik at el., Transceiver Front-End with Integrated TX/RX Commutator for Bluetooth Applications, Publication: ESSCIRC 2002, IEEE international.

* cited by examiner

US 8,787,964 B2

INTEGRATED RADIO FREQUENCY FRONT-END CIRCUIT

CROSS REFERENCE TO RELATED APPLICATIONS

This application claims the benefit of non-provisional patent application number 1752/CHE/2010 titled "Integrated Radio Frequency Front-End Circuit", filed on Jun. 23, 2010 in the Indian Patent Office.

The specification of the above referenced patent application is incorporated herein by reference in its entirety.

BACKGROUND

Short range wireless systems utilizing radio frequency (RF) integrated circuits use time division multiplexing for transmitting and receiving signals. The transmitted signals and the received signals use the same frequency band. However, the transmitting (Tx) and receiving (Rx) paths often use differential signaling after a certain stage for increasing performance. The short range wireless systems use a single antenna for both transmission (Tx) and reception (Rx) of signals by utilizing a transmit and receive (T/R) switch. The transmit and receive (T/R) switch toggles the antenna between transmission (Tx) and reception (Rx). The transmit and receive (T/R) switch needs high linearity at high signal swing. A block diagram of a conventional radio frequency (RF) front-end with a transmit and receive (T/R) switch is shown in FIG. 1. For each communication band, the transmit and receive (T/R) switch couples an antenna and a balun either to a low noise amplifier (LNA) of a receiver or to a power amplifier (PA) of a transmitter.

Differential implementation of radio frequency front-ends and analog circuit sections is a critical need, particularly in system-on-a-chip (SOC) scenarios which are characterized by noisy environment and different package requirements. Input lines of the receiver low noise amplifier (LNA) and output lines of the transmitter power amplifier (PA) can either be combined on-chip with common pins brought out for antenna connection or separate pins brought out and combined externally for further connection to an antenna. Conventionally, both these methods are complex and require many internal or external components. These methods often involve having the transmit and receive (T/R) switch disconnect a transmitter (Tx) during a receiver (Rx) operation and vice versa. The transmit and receive (T/R) switch losses directly affect the receiver (Rx) sensitivity and transmitter (Tx) output power delivery. Transmit and receive (T/R) operation can also be implemented using on-chip transformer component. However the on-chip radio frequency (RF) transformer component is not available in many foundries. Furthermore, the on-chip radio frequency (RF) transformer component is not well characterized and induces several signal losses upon implementation.

It would be desirable if the entire radio frequency (RF) front-end could be integrated with the baseband and radio or portions eliminated and the remainder be fully integrated for short range wireless, cellular and other communications.

Hence there is a long felt but unresolved need for a compact radio frequency (RF) front-end with reduced chip area (real estate), reduced energy dissipation, reduced signal loss, reduced switching loss, and reduced cost of manufacture while providing a variety of circuit and system products.

SUMMARY OF THE INVENTION

This summary is provided to introduce a selection of concepts in a simplified form that are further described in the detailed description of the invention. This summary is not intended to identify key or essential inventive concepts of the claimed subject matter, nor is it intended for determining the scope of the claimed subject.

The integrated radio frequency (RF) front-end circuit disclosed herein addresses the above stated need for a compact radio frequency (RF) front-end with reduced chip area (real estate), reduced energy dissipation, reduced signal loss, reduced switching loss, and reduced cost of manufacture.

The radio frequency (RF) front-end circuit disclosed herein comprises a) a balun comprising a center-tapped inductor having a first node, a center-tap switchlessly coupled to a fixed voltage, and a second node, wherein the balun receives a single-ended signal through the first node of the center-tapped inductor and converts the single-ended signal to a differential signal, wherein the balun receives the differential signal through the first node and the second node and converts the differential signal to the single-ended signal, and wherein the differential signal is available at the first node and the second node, and the single-ended signal is available at the first node; b) a receiver radio frequency amplifier (Rx RFA) having balanced input lines connected to the first node and the second node for reception and amplification of the differential signal, wherein the receiver radio frequency amplifier (Rx RFA) comprises one or more first active components; c) a radio frequency power amplifier (RFPA) having balanced output lines connected to the first node and the second node for providing an amplified differential signal to the balun, wherein the radio frequency power amplifier (RFPA) comprises one or more second active components; and d) a selector circuit in communication with the receiver radio frequency amplifier (Rx RFA) and the radio frequency power amplifier (RFPA) for activating the active components of the receiver radio frequency amplifier (Rx RFA) and deactivating the active components of the radio frequency power amplifier (RFPA) during the conversion of the single-ended signal to the differential signal, and vice versa during the conversion of the differential signal to the single-ended signal; whereby the balun is switchlessly and selectively coupled to the receiver radio frequency amplifier (Rx RFA) during the conversion of the single-ended signal to the differential signal and the radio frequency power amplifier (RFPA) during the conversion of the differential signal to the single-ended signal.

The fixed voltage to which the center-tap is switchlessly coupled to is either a supply ground or a supply voltage.

Active components of the receiver radio frequency amplifier (Rx RFA) and the radio frequency power amplifier (RFPA) are selectively activated and deactivated to separately utilize the same center-tapped inductor balun and other passive components, thereby rendering a compact radio frequency (RF) front-end. The active components of the receiver radio frequency amplifier (Rx RFA) and the radio frequency power amplifier (RFPA) comprise one or more transistors. The selector circuit switches on the transistors of the receiver radio frequency amplifier (Rx RFA) during conversion of the single-ended signal to a differential signal and switches on the transistors of the radio frequency power amplifier (RFPA) during conversion of the differential signal to a single-ended signal.

The radio frequency (RF) front-end circuit further comprises an antenna coupled to either the first node or the second node of the center-tapped inductor. The impedance of the antenna approximately matches the input impedance of the receiver radio frequency amplifier (Rx RFA) and also approximately matches the output impedance of the radio frequency power amplifier (RFPA). If, for example, the impedance of the antenna is Rin, a receiver radio frequency amplifier (Rx RFA) with balanced input lines, each having an impedance of 2Rin is selected. Similarly, for example, if the impedance of the antenna is $R_L$, a radio frequency power amplifier (RFPA) with balanced output lines, each having an impedance of $2R_L$ is selected.

The radio frequency (RF) front-end circuit further comprises a programmable logic circuit for programming the selector circuit for activating the active components of the receiver radio frequency amplifier (Rx RFA) and deactivating the active components of the radio frequency power amplifier (RFPA) during the conversion of a single-ended signal to a differential signal, and vice versa during the conversion of a differential signal to a single-ended signal.

In an embodiment, a radio frequency power amplifier (RFPA) having a single-ended output line is used to construct a radio frequency (RF) front-end circuit.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and instrumentalities disclosed herein.

DETAILED DESCRIPTION OF THE INVENTION

Figure 1:
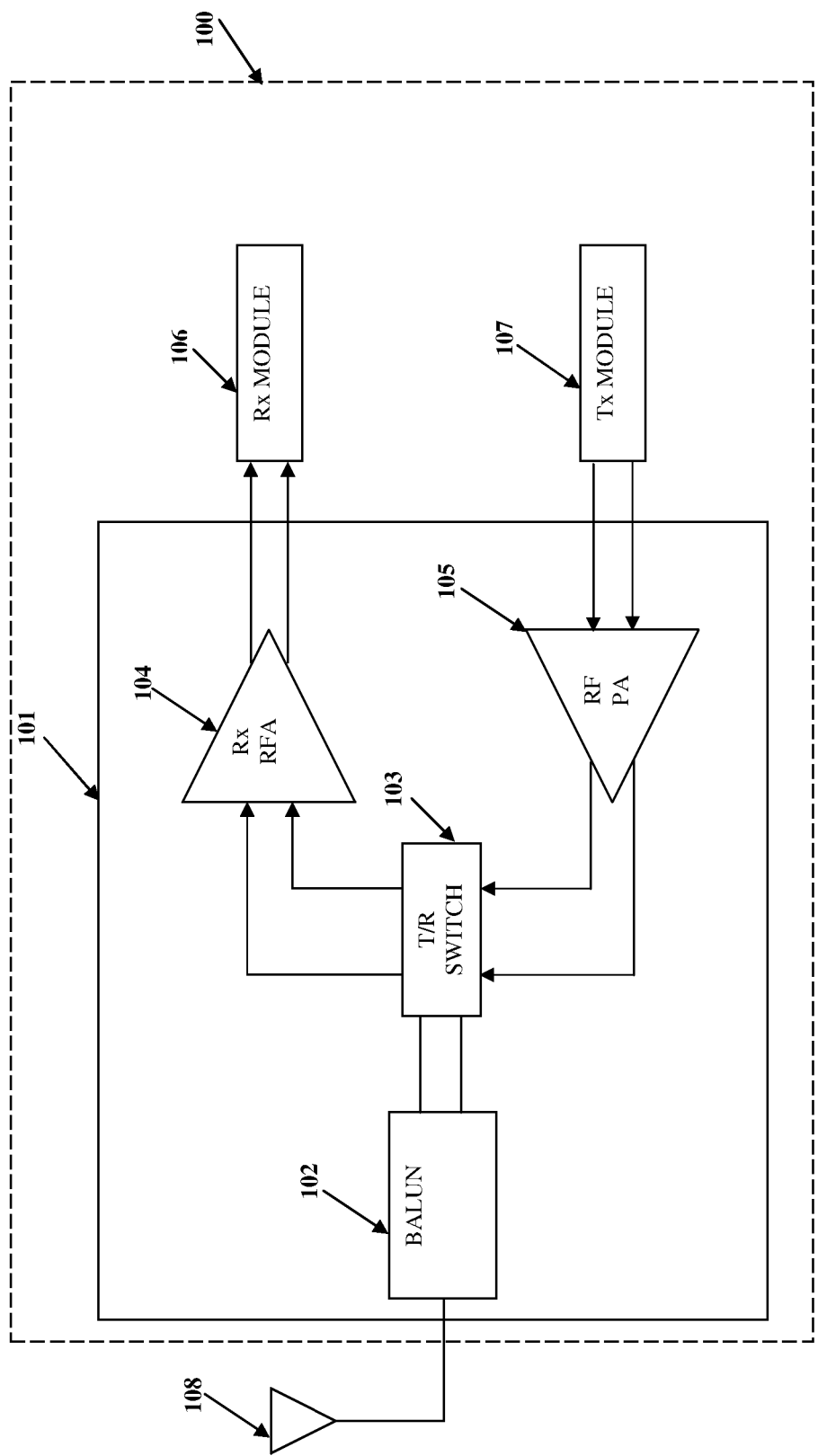
FIG. 1 illustrates a block diagram of a front-end of a radio frequency transceiver having a transmit and receive switch.

FIG. 1 illustrates a block diagram of a front-end 101 of a radio frequency (RF) transceiver 100 having a transmit and receive (T/R) switch 103. The radio frequency (RF) transceiver 100 is used to implement two-way radio communication and may be incorporated in wireless radio communication devices. The radio frequency (RF) transceiver 100 comprises an antenna 108, a balun (balanced/unbalanced) 102, the transmit and receive (T/R) switch 103, a receiver radio frequency amplifier (Rx RFA) 104, a radio frequency power amplifier (RFPA) 105, a receiver (Rx) module 106, and a transmitter (Tx) module 107. The balun 102, the transmit and receive (T/R) switch 103, the receiver radio frequency amplifier (Rx RFA) 104, and the radio frequency power amplifier (RFPA) 105 form the radio frequency (RF) front-end 101, where the receiver radio frequency amplifier (Rx RFA) 104 is for example, a low noise amplifier (LNA). The antenna 108 receives an incoming single-ended radio frequency (RF) signal and transmits an outgoing single-ended radio frequency (RF) signal. The single-ended radio frequency (RF) signal is herein referred as a single-ended signal.

A single-ended signal is used in single-ended signaling. Single-ended signaling is a method of transmitting signals over wires. One wire carries a varying voltage that represents the single-ended signal, while the other wire is connected to a reference voltage which is usually ground.

A balun 102 is an electronic circuit, generally used to convert a single-ended signal to a differential signal and conversely, to convert a differential signal to a single-ended signal. Therefore, a single-ended signal may, for example, be received from sources other than the antenna 108, as illustrated in FIG. 1. For example, the radio frequency (RF) front-end 101 may be an intermediate circuit that receives a single-ended signal from a single-ended radio frequency (RF) source and converts the received single-ended signal to a differential signal. Conversely, the radio frequency (RF) front-end 101 may also receive a differential signal from a differential signal source and convert the differential signal to a single-ended signal. After the conversion, the differential signal and the single-ended signal may for example, be used by one or more adjoining electronic circuits.

A differential signal comprises two complementary components sent on two separate wires. In the radio frequency (RF) transceiver 100, a single-ended signal, for example, an incoming single-ended signal from the antenna 108 is converted to a differential signal by the balun 102. The differential signal from the balun 102 is provided to the receiver radio frequency amplifier (Rx RFA) 104 for amplification. The amplified differential signal from the receiver radio frequency amplifier (Rx RFA) 104 is then provided to the receiver (Rx) module 106. Conversely, the radio frequency power amplifier (RFPA) 105 receives a differential signal from the transmitter (Tx) module 107 for amplification. The differential signal is amplified by the radio frequency power amplifier (RFPA) 105. The balun 102 converts the amplified differential signal to a single-ended signal. The single-ended signal is provided to the antenna 108 for transmission.

The transmit and receive (T/R) switch 103 allows utilization of the balun 102 and the antenna 108 by the receiver (Rx) module 106 and the transmitter (Tx) module 107, at different time instances. During a receiving mode, the transmit and receive (T/R) switch 103 routes an incoming differential signal from the balun 102 to the receiver radio frequency amplifier (Rx RFA) 104 and maintains an open circuit for an outgoing differential signal from the radio frequency power amplifier (RFPA) 105 to the balun 102. Conversely, during a transmitting mode, the transmit and receive (T/R) switch 103 routes the outgoing differential signal from the radio frequency power amplifier (RFPA) 105 to the balun 102 and maintains an open circuit for an incoming single-ended signal.

Figure 2:
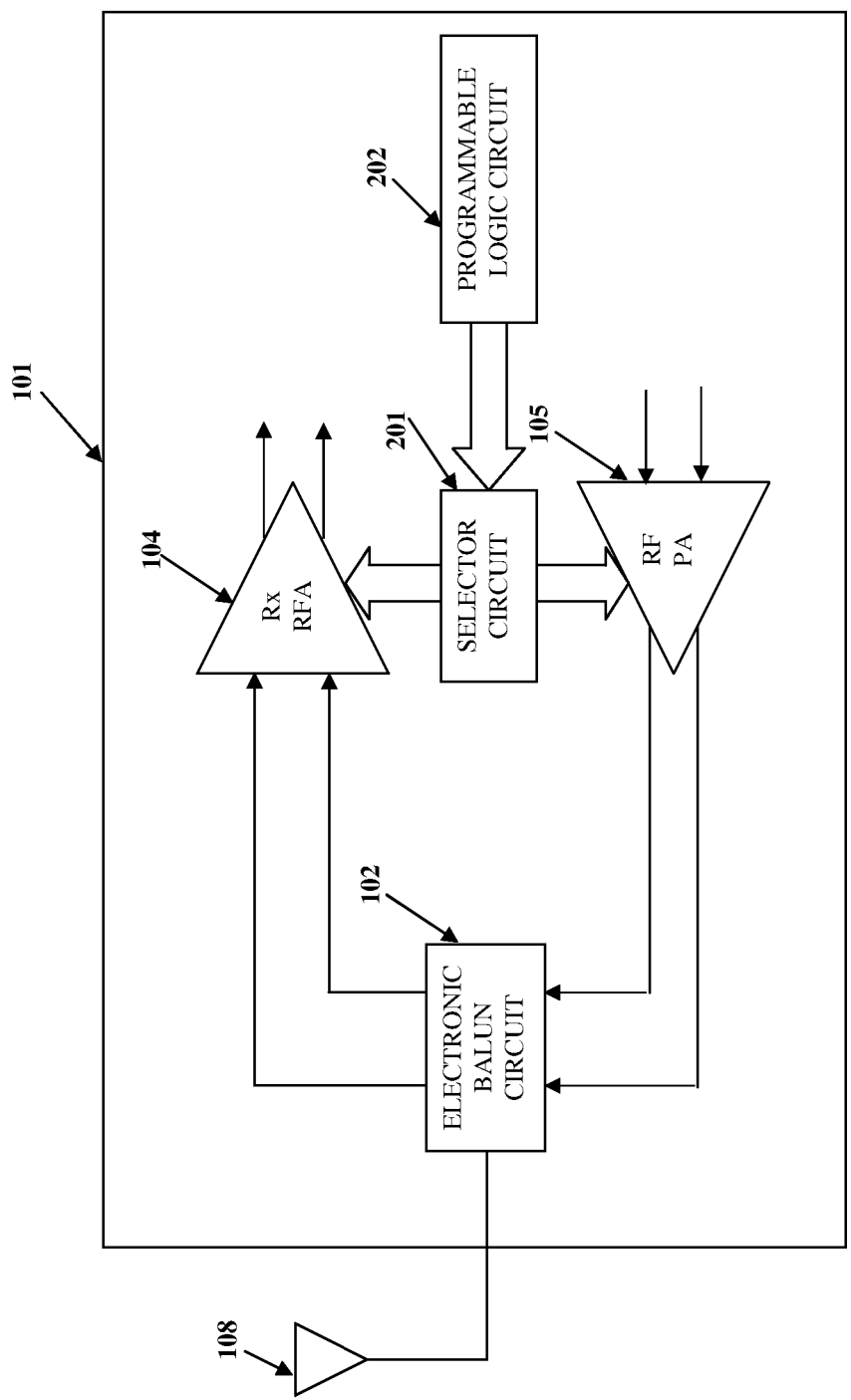
FIG. 2 illustrates a block diagram of a radio frequency front-end of this embodiment.

FIG. 2 illustrates a block diagram of a radio frequency (RF) front-end 101 of this embodiment. The radio frequency (RF) front-end 101 of FIG. 2 is similar to the radio frequency (RF) front-end 101 of FIG. 1, except for the elimination of the transmit and receive (T/R) switch 103. The radio frequency (RF) front-end 101 comprises a selector circuit 201 for alternately selecting the receiver radio frequency amplifier (Rx RFA) 104 during reception of a single-ended signal and the radio frequency power amplifier (RFPA) 105 during transmission of a single-ended signal.

Figure 3A:
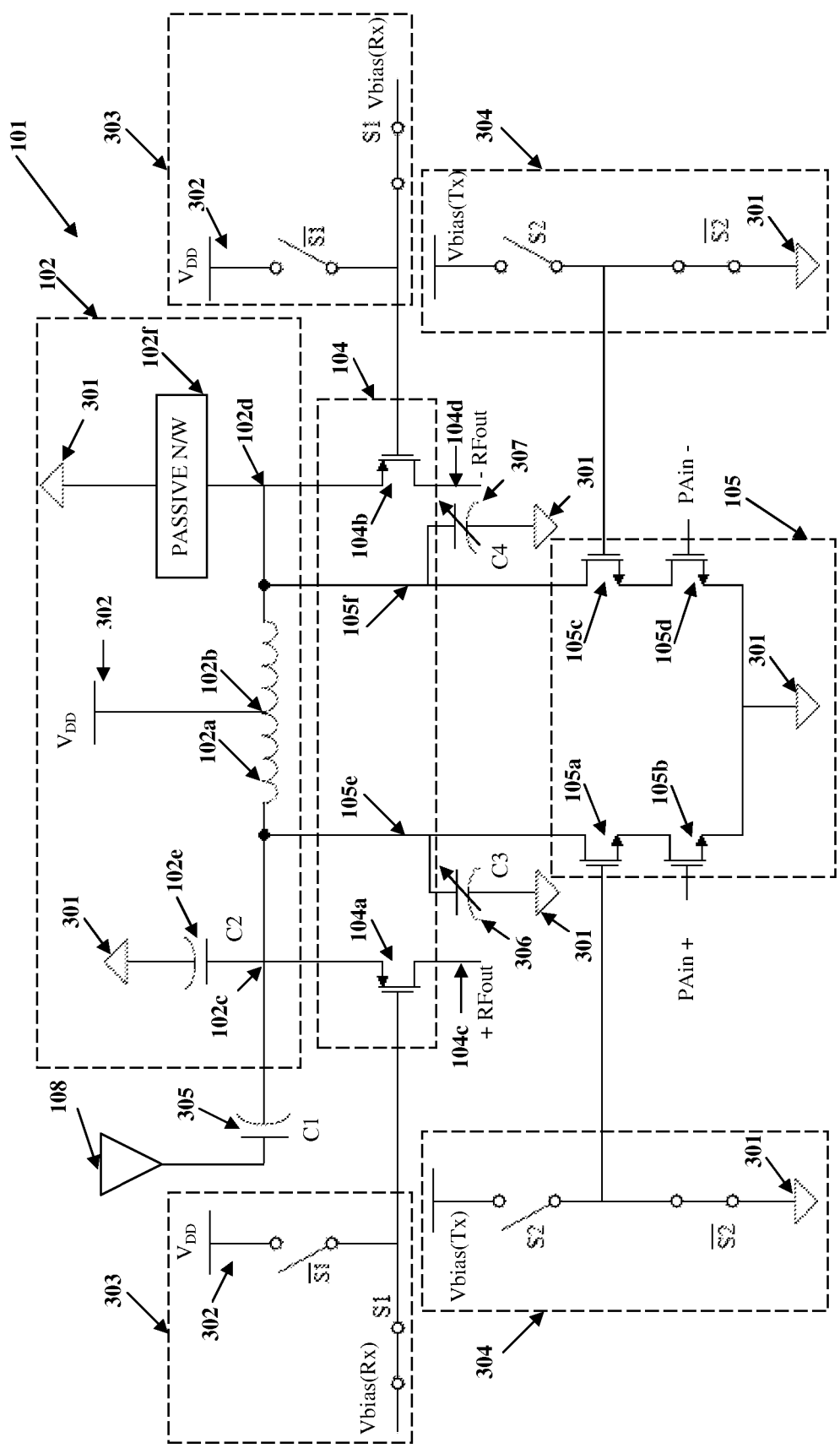
FIG. 3A illustrates a schematic diagram of a radio frequency front-end circuit of this embodiment.

FIG. 3A illustrates a schematic diagram of a radio frequency (RF) front-end circuit 101 of this embodiment. The radio frequency (RF) front-end circuit 101 comprises a balun 102, a receiver radio frequency amplifier (Rx RFA) 104, and a radio frequency power amplifier (RFPA) 105. The balun 102 comprises a center-tapped inductor 102a having a first node 102c, a center-tap 102b switchlessly coupled to a fixed voltage source 302, and a second node 102d. The radio frequency (RF) front-end circuit 101 illustrated in FIG. 3A is exemplarily implemented using a p-type metal oxide semiconductor field effect transistor (p-MoSFET) based Rx RFA 104 and an n-type metal oxide semiconductor field effect transistor (n-MoSFET) based radio frequency power amplifier (RFPA) 105. For the above configuration and as illustrated in FIG. 3A, a supply voltage $V_{DD}$ 302 is given as the fixed voltage source 302. A supply ground 301 for example, is also considered a fixed voltage source 302. The supply ground is herein also referred to as a signal ground. The balun 102 receives a single-ended signal through the first node 102c of the center-tapped inductor 102a and converts the single-ended signal to a differential signal. The differential signal is available at the first node 102c and the second node 102d of the center-tapped inductor 102a.

The radio frequency (RF) front-end circuit 101 of FIG. 3A can be readily converted to another embodiment comprising, an n-MoSFET based receiver radio frequency power amplifier (Rx RFA) 104 and a p-MoSFET based radio frequency power amplifier (RFPA) 105, with the center-tap 102b of the center-tapped inductor 102a connected to a supply ground 301.

Most radio frequency (RF) signal transmissions are single-ended and conversion from a single-ended signal to a differential signal is performed during reception of the single-ended signal. The center-tapped inductor 102a of the balun 102 converts the single-ended signal to a differential signal. For example, a single-ended signal received at the first node 102c, creates a strong mutual coupling among windings of the center-tapped inductor 102a located between the first node 102c and the center-tap 102b, and the second node 102d and the center-tap 102b. The single-ended signal received at the first node 102c traverses the windings between the first node 102c and the center-tap 102b of the balun 102, inducing a complementary single-ended signal in the windings between the second node 102d and the center-tap 102b. The complementary single-ended signal is nominally opposite in phase to the single-ended signal. Due to mutual coupling, the sum of AC voltage due to the single-ended signal at the first node 102c and AC voltage due to the complementary single-ended signal at the second node 102d of the center-tapped inductor 102a become nominally equal to the voltage at the center-tap 102b. By coupling the center-tap 102b to the fixed voltage source $V_{DD}$ 302 or the signal ground 301 and applying the single-ended signal at the first node 102c, a voltage is generated at the second node 102d which is nominally opposite in phase to the single-ended signal at the first node 102c. However, the voltage generated at the second node 102d may be equal in magnitude to the single-ended signal at the first node 102c. Accordingly, the differential electronic signal is generated at the first node 102c and second node 102d, where one component of the differential signal is obtained at the first node 102c and another component of the differential signal is obtained at the second node 102d.

Further, the first node 102c and the second node 102d receive the differential signal, and the balun 102 converts the differential signal to a single-ended signal. The complementary components of the differential signal constructively add up after conversion by the balun 102, to provide a single-ended signal. For example, consider the two complementary signals as current signals. A first of the two complementary current signals of the differential signal may be represented as Irfp (not shown) and a second of the two complementary current signals of the differential signal may be represented as Irfn (not shown).

The center-tap inductor 102a induces a complementary signal of Irfn, represented as Ixx (not shown) at windings between the first node 102c and the center-tap 102b. The complementary signal of Irfn is nominally equal in magnitude and opposite in phase to Irfn. Accordingly, Irfp and the complementary signal of Irfn at the windings between the first node 102c and the center-tap 102b constructively add up to produce a single-ended signal which is available at the first node 102c of the center-tapped inductor 102a.

Figure 3B:
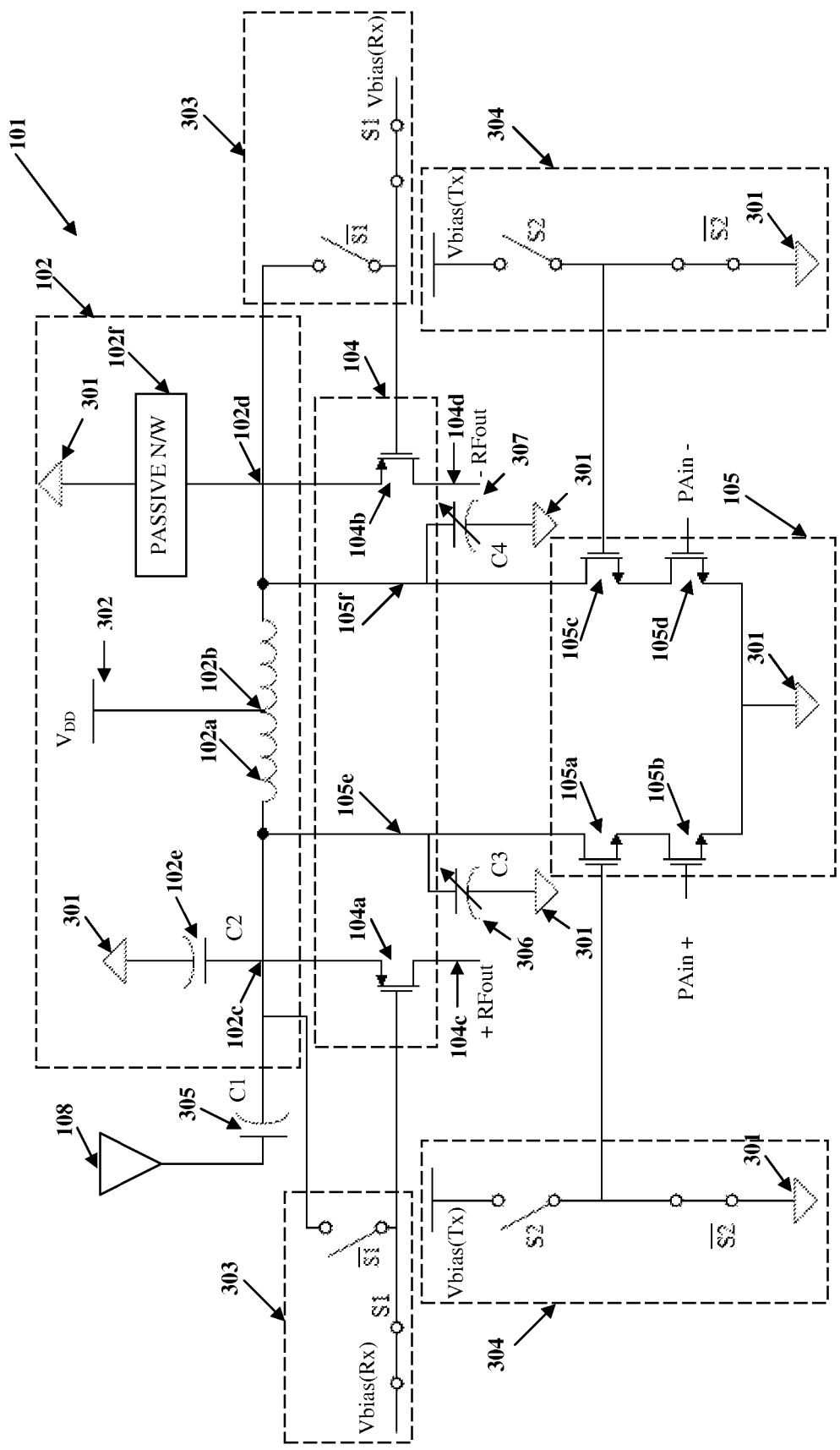
FIG. 3B illustrates another embodiment of the radio frequency front-end circuit illustrated in FIG. 3A.

The receiver radio frequency amplifier (Rx RFA) 104 comprises balanced input lines 104c and 104d connected to the first node 102c and the second node 102d of the center-tapped inductor 102a. Balanced input lines 104c and 104d of the receiver radio frequency amplifier (Rx RFA) 104 imply that each of the input lines 104c and 104d of the receiver radio frequency amplifier (Rx RFA) 104 provide equal input impedances. For an antenna having an impedance of Rin, impedance match may be achieved between the antenna 108 and the first node 102c by selecting a receiver radio frequency amplifier (Rx RFA) 104 having balanced input lines 104c and 104d, each providing an input impedance of 2Rin at the first node 102c. Therefore, a single-ended signal incoming from the antenna 108 at the first node 102c will face an input impedance Rin, equal to effective impedance of the input impedances of balanced input lines 104c and 104d, due to parallel configuration of the balanced input lines 104c and 104d, as illustrated in FIGS. 3A and 3B. In an embodiment, each balanced input lines 104c and 104d is coupled to an impedance source having a nominal impedance value 2Rin.

The receiver radio frequency amplifier (Rx RFA) 104 receives the differential signal from the balun 102 through the balanced input lines 104c and 104d and amplifies the differential signal. In an embodiment, the receiver radio frequency amplifier (Rx RFA) 104 is for example, a low noise amplifier (LNA) for amplifying radio frequency (RF) signals. Further, the receiver radio frequency amplifier (Rx RFA) 104 comprises active components such as transistors, resistors, capacitors, etc. The transistors in the receiver radio frequency amplifier (Rx RFA) 104 amplify the radio frequency (RF) signals, and the resistors and capacitors tune the receiver radio frequency amplifier (Rx RFA) 104 to an appropriate operating frequency.

The radio frequency power amplifier (RFPA) 105 comprises balanced output lines 105e and 105f connected to the first node 102c and the second node 102d of the center-tapped inductor 102a. Balanced output lines 105e and 105f of the radio frequency power amplifier (RFPA) 105 imply that the output lines 105e and 105f of the radio frequency power amplifier (RFPA) 105 have equal output impedances. Each of the balanced output lines 105e and 105f carries one of two complementary current signals of the differential signal from the radio frequency power amplifier (RFPA) 105 to the first node 102c and the second node 102d, respectively. The radio frequency power amplifier (RFPA) 105 amplifies the differential signal received from for example, the transmitter (Tx) module 107 and provides the amplified differential signal to the balun 102 through the balanced output lines 105e and 105f. The balun 102 converts the differential signal to a single-ended signal which is then provided to the antenna 108 for transmission. For an outgoing single-ended signal at first node 102c, impedance match between the antenna 108 and the radio frequency (RF) front-end circuit 101 is achieved at the first node 102c by selecting a radio frequency power amplifier (RFPA) 105 having effective impedance at node 102c equal to antenna 108 impedance $R_L$. For example, if the output impedance of each of the balanced output lines 105e and 105f is configured as $2R_L$, the single-ended signal leaving the first node 102c will face an effective impedance of $R_L$ due to effective parallel configuration of the balanced output lines 105e and 105f. Therefore, impedance match is achieved between the antenna 108 and the first node 102c.

The radio frequency power amplifier (RFPA) 105 comprises one or more active components such as transistors, resistors, capacitors, etc. The transistors 104a and 104b amplify the differential signal received from the transmitter (Tx) module 107 and the resistors and capacitors tune the radio frequency power amplifier (RFPA) 105 to an appropriate operating frequency.

The selector circuit 201 is in communication with receiver radio frequency amplifier (Rx RFA) 104 and radio frequency power amplifier (RFPA) 105 for activating the active components of the receiver radio frequency amplifier (Rx RFA) 104 and deactivating the active components of the radio frequency power amplifier (RFPA) 105 during conversion of a single-ended signal to a differential signal. The selector circuit 201 also activates the active components of the radio frequency power amplifier (RFPA) 105 and deactivates the active components of the receiver radio frequency amplifier (Rx RFA) 104 during conversion of a differential signal to a single-ended signal.

The radio frequency (RF) transceiver 100 for example, comprises a programmable logic circuit 202 for programming the selector circuit 201 to activate or deactivate the transistors 104a and 104b of the receiver radio frequency amplifier (Rx RFA) by switching on or switching off the transistors 104a and 104b. The programmable logic circuit 202 also programs the selector circuit 201 to activate or deactivate the transistors 105a and 105c of the radio frequency power amplifier (RFPA) 105 by switching on or switching off the transistors 105a and 105c. The selector circuit 201 utilizes switch S1 303 to switch on or switch off the transistors 104a and 104c of the receiver radio frequency amplifier (Rx RFA) 104 and switch S2 304 to switch on or switch off the transistors 105a and 105c of the radio frequency power amplifier (RFPA) 105. Thus, the balun 102 is switchlessly and selectively coupled to the receiver radio frequency amplifier (Rx RFA) 104 during conversion of the single-ended signal to a differential signal and the radio frequency power amplifier (RFPA) 105 during the conversion of the differential signal to the single-ended signal.

A passive network 102f couples the second node 102d to the signal ground 301 and matches the amplitudes of the complementary components of the differential signal generated at the first node 102c and the second node 102d. The passive network 102f may comprise a combination of passive components comprising one or more resistors, capacitors, and inductors.

As explained above, the active components of the receiver radio frequency amplifier (Rx RFA) 104 and radio frequency power amplifier (RFPA) 105 comprise transistors 104a and 104b, and 105a-105d. The receiver radio frequency amplifier (Rx RFA) 104 and radio frequency power amplifier (RFPA) 105 may be realized using transistors such as bipolar junction transistors (BJTs), field effect transistors (FETs) such as metal oxide semiconductor field effect transistors (MoSFETs), metal semiconductor field effect transistors (MeSFETs), metal insulator field effect transistors (MISFETs), etc. Flow of current between the source terminal and the drain terminal is based on bias voltage applied at the gate terminal. Similarly, a bipolar junction transistor (BJT) comprises an emitter terminal, a base terminal, and a collector terminal. Flow of current between the emitter terminal and the collector terminal is based on the sign and magnitude of the voltage applied at the base terminal.

In an embodiment, receiver radio frequency amplifier (Rx RFA) 104 is realized using two p-type metal oxide semiconductor field effect transistors (p-MoSFETs) 104a and 104b, and the radio frequency power amplifier (RFPA) 105 is realized using four n-type metal oxide semiconductor field effect transistors (n-MoSFETs) 105a-105d. In this embodiment, during conversion of an incoming single-ended signal to a differential signal, the p-MoSFETs 104a and 104b of the receiver radio frequency amplifier (Rx RFA) 104 are switched on and the n-MoSFETs 105a and 105c of the radio frequency power amplifier (RFPA) 105 are switched off. This facilitates amplification of the differential signal received from the balun 102 by the receiver radio frequency amplifier (Rx RFA) 104. Furthermore, the n-MoSFETs 105a and 105c of the radio frequency power amplifier (RFPA) 105 are switched on while the p-MoSFETs 104a and 104b of the receiver radio frequency amplifier (Rx RFA) 104 are switched off. The radio frequency power amplifier (RFPA) 105 provides an amplified differential signal to the balun 102. The balun 102 converts the amplified differential signal to a single-ended signal.

Conversion of an incoming single-ended signal to a differential signal is considered as a receiving mode of the radio frequency (RF) front-end circuit 101 operation. In the receiving mode, the balun 102 converts the incoming single-ended signal to a differential signal. The differential signal is provided to the receiver radio frequency amplifier (Rx RFA) 104 for amplification. Similarly, conversion of an amplified differential signal to a single-ended signal is considered as a transmitting mode of the radio frequency (RF) front-end circuit 101 operation. In the transmitting mode, the balun 102 converts the amplified differential signal provided by the radio frequency power amplifier (RFPA) 105 to a single-ended signal. The single-ended signal is provided to an antenna 108 for transmission.

In this embodiment, the radio frequency (RF) front-end circuit 101 may be used to convert an incoming single-ended signal to a differential signal by programming the selector circuit 201 to switch on the p-MoSFETs 104a and 104b of the receiver radio frequency amplifier (Rx RFA) 104 using the switch S1 303 and switch off the n-MoSFETs 105a and 105c of the radio frequency power amplifier (RFPA) 105 using the switch S2 304. The selector circuit 201 sends control signals to switch S1 303 and switch S2 304. In response, switch S1 303 switches on the p-MoSFETs 104a and 104b by connecting the gate terminals of the p-MoSFETs 104a and 104b to a bias voltage Vbias(Rx) that is at least lesser than voltage at the source terminals by a threshold voltage $V_{TH}$(p-MoSFET). Furthermore, amplification of the differential signal may also be controlled by controlling the voltage difference between the gate terminal and the source terminal. The switch S2 304 switches off the n-MoSFETs 105a and 105c of the radio frequency power amplifier (RFPA) 105 by grounding the gate terminals. The drain terminals of the p-MoSFETs 104a and 104b of the receiver radio frequency amplifier (Rx RFA) 104 provide the amplified components of the differential signal +RFout and −RFout. The amplified components of the differential signal +RFout and −RFout are provided to the receiver (Rx) module 106 for further processing. FIG. 3A exemplarily illustrates the operation of the radio frequency (RF) front-end circuit 101 in the receiving mode.

For amplifying a differential signal during transmitting mode, the selector circuit 201 may be programmed to switch off the p-MoSFETs 104a and 104b of the receiver radio frequency amplifier (Rx RFA) 104 using the switch S1 303 and switch on the n-MoSFETs 105a and 105c of the radio frequency power amplifier (RFPA) 105 using the switch S2

304. The selector circuit 201 sends control signals to switch S1 303 and switch S2 304. In response, switch S1 303 switches off the p-MoSFETs 104a and 104b by connecting the gate terminals of the p-MoSFETs 104a and 104b to supply voltage $V_{DD}$ 302. The p-MoSFETs 104a and 104b may effectively be switched off by providing a fixed supply voltage $V_{DD}$ 302, greater than the voltage at source terminals of the p-MoSFETs 104a and 104b. The p-MoSFETs 104a and 104b may also be effectively switched off using switch S1 303 by connecting the gate terminals of the p-MoSFETs 104a and 104b to the source voltages of the p-MoSFETs 104a and 104b at nodes 102c and 102d, as illustrated in FIG. 3B. This connection establishes an equal voltage at the source terminals and the gate terminals of the p-MoSFETs 104a and 104b. Choice of voltage at the gate terminals of the p-MoSFETs 104a and 104b is based on a specific performance requirement.

Also in response to the selector circuit 201, the switch S2 304 connects the gate terminals of the n-MoSFETs 105a and 105b to a bias voltage Vbias(Tx) greater than a threshold voltage $V_{TH}$(n-MoSFET) for effectively switching on the n-MoSFETs 105a and 105c of the radio frequency power amplifier (RFPA) 105. In one example, the threshold voltage $V_{TH}$(Tx) is 0.5V and the n-MoSFETs 105a and 105c of the radio frequency power amplifier (RFPA) 105 are switched on by providing a bias voltage Vbias(Tx) greater than 0.5V. Differential signal components PAin+ and PAin− received from the Tx module 107 are amplified by the n-MoSFETs 105b and 105d of the radio frequency power amplifier (RFPA) 105. The two complementary current signals of the differential signal, Irfp and Irfn are then provided to the balun 102 for converting the two complementary current signals of the differential signal to a single-ended signal having an amplitude which is nominally equal to 2*Irfp.

As explained above, the radio frequency (RF) front-end circuit 101 also comprises a programmable logic circuit 202. The programmable logic circuit 202 programs the selector circuit 201 for activating the active components of the receiver radio frequency amplifier (Rx RFA) 104 and deactivating the active components of the radio frequency power amplifier (RFPA) 105 during conversion of a single-ended signal to a differential signal, and vice versa during conversion of a differential signal to a single-ended signal.

In the above embodiment, the transmit and receive (T/R) switch 103 illustrated in FIG. 1 is implicitly implemented using the p-MoSFETs 104a and 104b of the receiver radio frequency amplifier (Rx RFA) 104, and the n-MoSFETs 105a and 105c of the radio frequency power amplifier (RFPA) 105. Accordingly, the transmit and receive (T/R) switch 103 does not intrude the path of the differential signal provided by the balun 102 to the receiver radio frequency amplifier (Rx RFA) 104 or the path of the differential signal provided to the balun 102 by the radio frequency power amplifier (RFPA) 105. Since there is no explicit switch between the balun 102 and the receiver radio frequency amplifier (Rx RFA) 104 and between the balun 102 and the radio frequency power amplifier (RFPA) 105, there is no switching loss commonly associated with a radio frequency (RF) front-end 101 having an explicit switch between the transmit and receive signal paths. Furthermore, there is no loss in receiver sensitivity and transmitter sensitivity due to the absence of an explicit switch in the receiver and transmitter signal paths.

Capacitor C1 305 connected between the antenna 108 and the first node 102c is a decoupling capacitor 305. The decoupling capacitor C1 305 blocks direct current (DC) components incoming from the antenna 108. Furthermore, the decoupling capacitor C1 is variable to set an appropriate capacitance value to cope with any variation of power of the radio frequency (RF) signal incoming from the antenna 108. Capacitor C2 102e coupling the first node 102c to the signal ground 301 represents an effective capacitance 102e at the first node 102c. The effective capacitance 102e at the first node 102c is a combination of an explicit capacitor used to tune the balun 102 at the operating frequency and parasitic capacitance at the first node 102c. Furthermore, programmable capacitors C3 306 and C4 307 coupled to the signal ground may, for example, be used to remove parasitic capacitance difference present between the first node 102c and the second node 102d of the center-tapped inductor 102a during receiving and transmitting modes.

The center-tap 102b of center-tap inductor 102a is switchlessly connected to a fixed voltage source $V_{DD}$ 302. Connecting the center-tap 102b to the fixed voltage source $V_{DD}$ 302 precludes the need for switching to different potentials during the receiving mode and the transmitting mode. If a switch (not shown) is utilized to connect the center-tap 102b to different potentials, the switch carries a significant amount of supply current. This is particularly true in case of the radio frequency power amplifier (RFPA) 105. The resistance of the switch and parasitic capacitance introduced by the switch is a critical factor that affects the performance of the radio frequency (RF) front-end circuit 101. Therefore, performance of the radio frequency (RF) front-end circuit 101 may be enhanced by avoiding a switch in center-tap 102b.

In another embodiment, impedance matching is achieved between the antenna 108 and the receiver radio frequency amplifier (Rx RFA) 104 for transferring the single-ended signal from the antenna 108 to the balun 102 without considerable loss in power of the single-ended signal. The receiver radio frequency amplifier (Rx RFA) 104 for example, provides input impedance equal to impedance of the antenna 108 at the first node 102c. Similarly, impedance matching is also achieved between the antenna 108 and the radio frequency power amplifier (RFPA) 105 for transferring the single-ended electronic signal from the balun 102 to the antenna 108, wherein an amplified differential signal provided by the radio frequency power amplifier (RFPA) 105 is converted to a single-ended signal by the balun 108.

Figure 4:
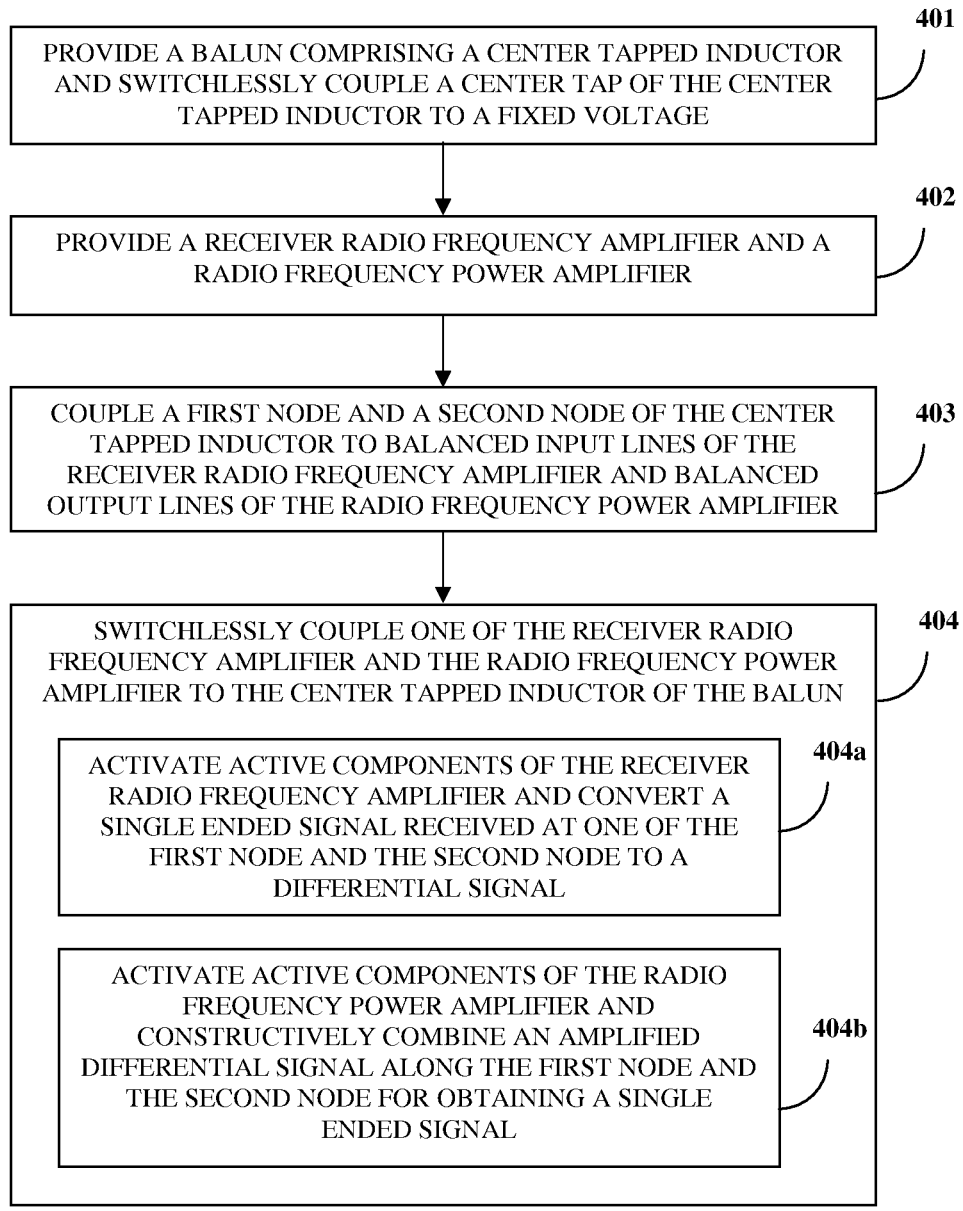
FIG. 4 illustrates a method of alternately accessing a balun in a radio frequency front-end circuit.

FIG. 4 illustrates a method of selectively accessing a balun 102 in a radio frequency (RF) front-end circuit 101. First, a balun 102 comprising a center-tapped inductor 102a is provided 401. The center-tap 102b of the center-tapped inductor 102a is switchlessly coupled to a fixed voltage. The balun 102 for example, is as illustrated in FIGS. 3A and 3B. The fixed voltage is for example a supply voltage $V_{DD}$ 302, illustrated in FIGS. 3A, 3B, 5A, and 5B. A receiver radio frequency amplifier (Rx RFA) 104 and a radio frequency power amplifier (RFPA) 105 are provided 402. The receiver radio frequency amplifier (Rx RFA) 104 and the radio frequency power amplifier (RFPA) 105 comprise active components. A first terminal 102c and a second terminal 102d of the center-tapped inductor 102a are coupled 403 to balanced input lines 104c and 104d of the receiver radio frequency amplifier (Rx RFA) 104 and balanced output lines 105e and 105f of the radio frequency power amplifier (RFPA) 105 respectively. The active components of the receiver radio frequency amplifier (Rx RFA) 104 and the active components of the radio frequency power amplifier (RFPA) 105 comprise a combination of one or more transistors. Depending on the type of transistors used to realize the active components of the receiver radio frequency amplifier (Rx RFA) 104 and the active components of the radio frequency power amplifier (RFPA) 105, the fixed voltage is either the supply voltage $V_{DD}$ 302 or the supply ground 301. During any time instant, one of the receiver radio frequency amplifier (Rx RFA) 104 and the radio frequency power amplifier (RFPA) 105 are switchlessly coupled 404 to the center-tapped inductor 102a of the balun 102 to switchlessly and selectively access the balun 102.

For example, the receiver radio frequency amplifier (Rx RFA) 104 is switchlessly coupled to the balun 102 by activating 404a active components of the receiver radio frequency amplifier (Rx RFA) 104 and deactivating the active components of the radio frequency power amplifier (RFPA) 105. A single-ended signal received at one of the first node 102c and the second node 102d is converted to a differential signal by the balun 102. This differential signal is obtained at the first node 102c and the second node 102d. The differential signal is provided to the balanced input lines 104c and 104d of the receiver radio frequency amplifier (Rx RFA) 104. The receiver radio frequency amplifier (Rx RFA) 104 for example, amplifies the differential signal and provides it to a receiver (Rx) module 106 of a radio frequency (RF) transceiver 100, illustrated in FIG. 1, for further processing. Deactivating the active components of the radio frequency power amplifier (RFPA) 105 prevents the differential signal from entering the balanced output lines 105e and 105f of the radio frequency power amplifier (RFPA) 105. Therefore, the differential signal is not corrupted by the signals present at the balanced output lines 105e and 105f of the radio frequency power amplifier (RFPA) 105.

Similarly, the radio frequency power amplifier (RFPA) 105 is switchlessly coupled to the balun 102 by activating 404b the active components of the radio frequency power amplifier (RFPA) 105 and deactivating the active components of the receiver radio frequency amplifier (Rx RFA) 104. The radio frequency power amplifier (RFPA) 105 may receive a differential signal from a transmitter (Tx) module 107 of the radio frequency (RF) transceiver 100 and provide two complementary current signals of an amplified differential signal through the balanced output lines 105e and 105f. The amplified differential signal is converted to a single-ended signal by constructively combining the amplified differential signal along the first node 102c and the second node 102d to obtain a single-ended signal at the first node 102c. The single-ended signal obtained is nominally equal to twice the amplitude of each of the two complementary current signals of the differential signal. The single-ended signal is for example, transmitted through the antenna 108 or provided to an adjacent electronic circuit.

Figure 5A:
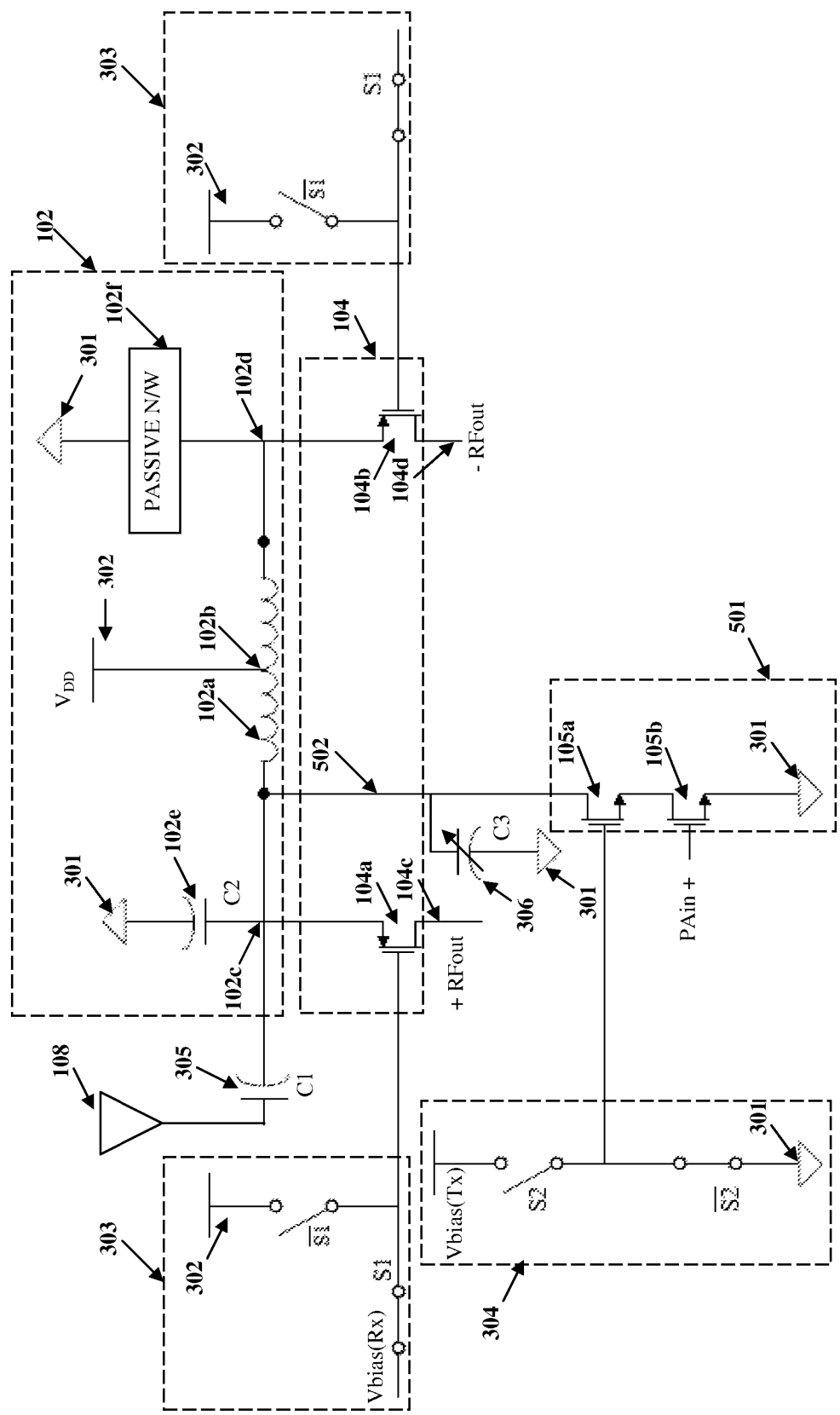
FIG. 5A illustrates a schematic diagram of the radio frequency front-end circuit comprising a single-ended radio frequency power amplifier.

FIG. 5A illustrates a schematic diagram of a radio frequency (RF) front-end circuit 101 comprising an embodiment of a single-ended radio frequency power amplifier (RFPA) 501. For applications that require only a single-ended radio frequency power amplifier 501 output for power amplifying a single-ended signal, one of the branches of the radio frequency power amplifier (RFPA) 105 illustrated in FIGS. 3A and 3B may be removed. The power amplified single-ended radio frequency (RF) signal is directly provided to one of the first and second nodes 102c and 102d of the center-tapped inductor 102a. As a result, a single-ended signal is obtained that is nominally equal in magnitude to the power amplified single-ended signal. If the power amplified single-ended signal is for example, provided to the first node 102c of the center-tapped inductor 102a and an antenna 108 is connected at the first node 102c, the transmitted single-ended signal is equal in phase to the power amplified single-ended signal. However, if the power amplified single-ended signal is for example, provided to the first node 102c of the center-tapped inductor 102a and the antenna 108 is connected at the second node 102d, the transmitted single-ended signal is opposite in phase to the power amplified single-ended signal.

Figure 5B:
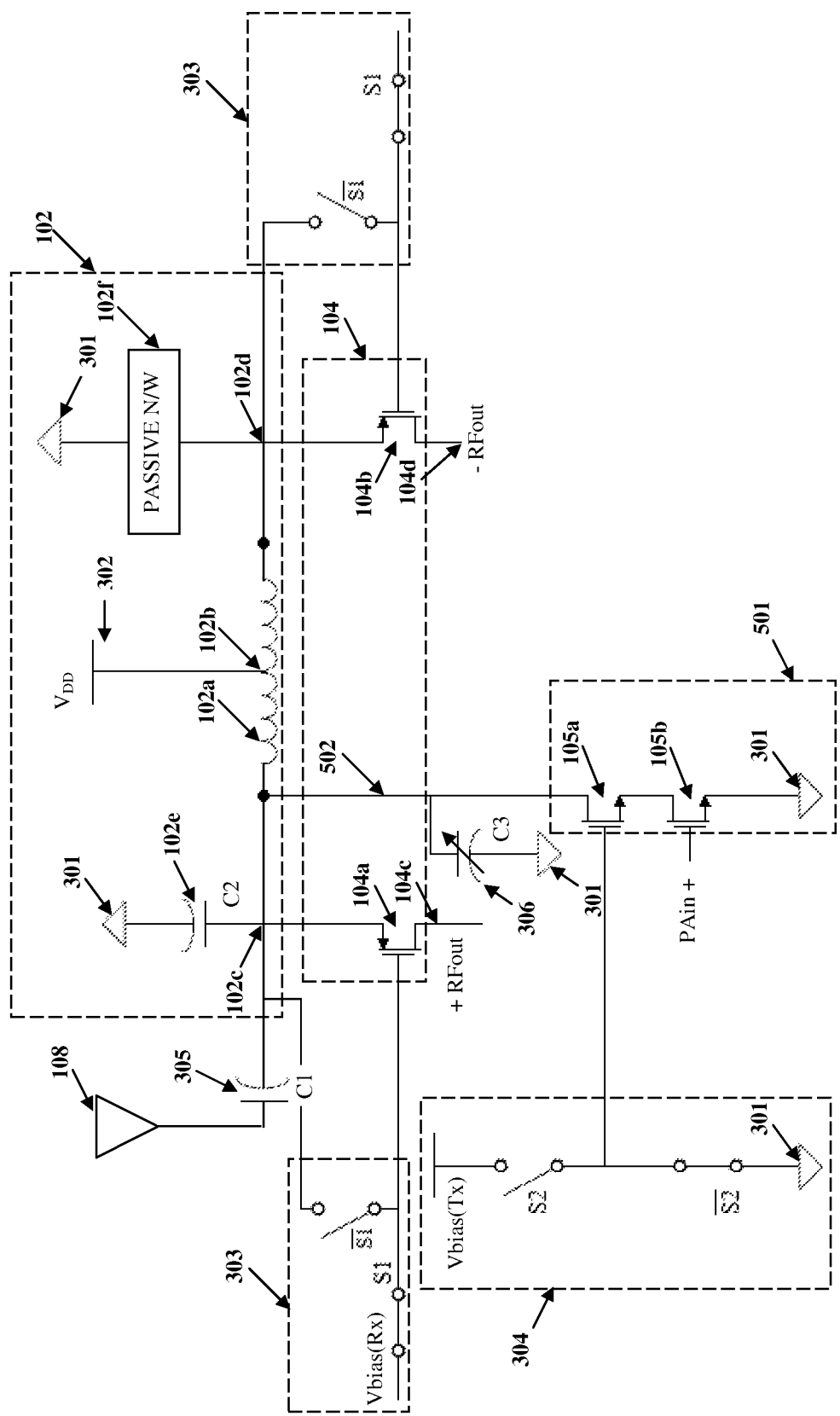
FIG. 5B illustrates another embodiment of the radio frequency front-end circuit illustrated in FIG. 5A.

The p-MoSFETs 104a and 104b may also be switched off using switch S1 303 by connecting the gate terminals of the p-MoSFETs 104a and 104b to the source voltages at nodes 102c and 102d, as illustrated in FIG. 5B. The p-MoSFETs 104a and 104b can be effectively switched off by providing equal voltages at the source terminals and the gate terminals of the p-MoSFETs 104a and 104b. Voltage at the gate terminals of the p-MoSFETs 104a and 104b is based on a specific performance requirement.

Figure 6:
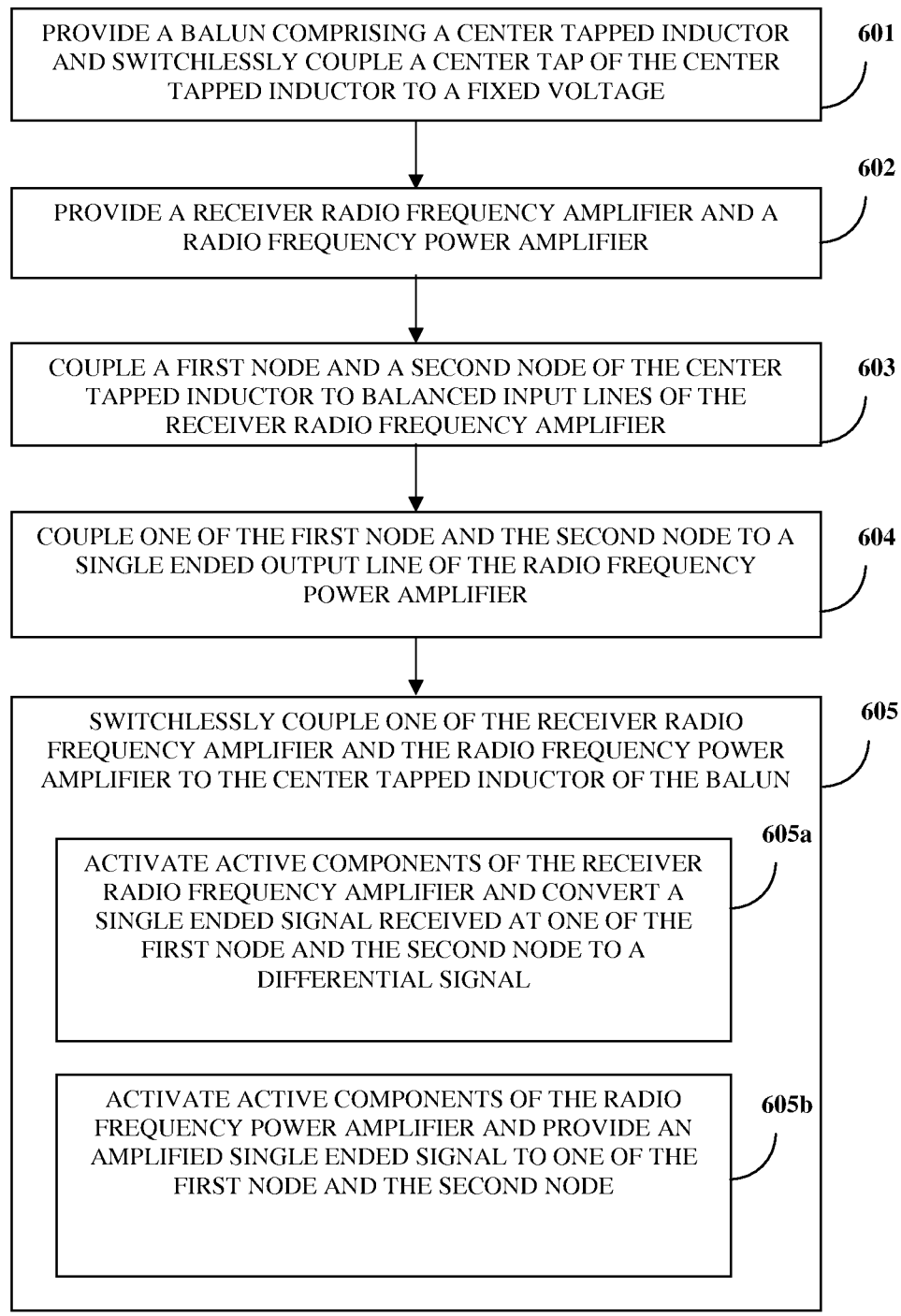
FIG. 6 illustrates a method of alternately accessing a balun in a radio frequency front-end circuit comprising a single-ended radio frequency power amplifier.

FIG. 6 illustrates a method of selectively accessing a balun 102 in a radio frequency front-end circuit 101 comprising a single-ended radio frequency power amplifier 501. A balun 102 comprising a center-tapped inductor 102a is provided 601. Center-tap 102b of the center-tapped inductor 102a is switchlessly coupled to a fixed voltage. A receiver radio frequency amplifier (Rx RFA) 104 and a radio frequency power amplifier (RFPA) 105 are provided 602. The receiver radio frequency amplifier (Rx RFA) 104 and the radio frequency power amplifier (RFPA) 105 comprise active components. Depending on the active components used to implement the receiver radio frequency amplifier (Rx RFA) 104 and the radio frequency power amplifier (RFPA) 501, the fixed voltage is for example a supply voltage $V_{DD}$ 302 or a supply ground 301. First node 102c and second node 102d of the center-tapped inductor 102a are coupled 603 to balanced input lines 104c and 104d of the receiver radio frequency amplifier (Rx RFA) 104. One of the first node 102c and the second node 102d is coupled 604 to the single-ended output line 502 of a single-ended radio frequency power amplifier (RFPA) 501. During any time instant, one of the receiver radio frequency amplifier (Rx RFA) 104 and the radio frequency power amplifier (RFPA) 501 are switchlessly coupled 605 to the center-tapped inductor 102a of the balun 102 to switchlessly and selectively access the balun 102.

For example, the receiver radio frequency amplifier (Rx RFA) 104 is switchlessly coupled to the balun 102 by activating 605a active components of the receiver radio frequency amplifier (Rx RFA) 104 and deactivating the active components of the radio frequency power amplifier (RFPA) 501. A single-ended signal received at one of the first node 102c and the second node 102d is converted to a differential signal by the balun 102. This differential signal is obtained at the first node 102c and the second node 102d. The obtained differential signal is provided to the balanced input lines 104c and 104d of the receiver radio frequency amplifier (Rx RFA) 104. The receiver radio frequency amplifier (Rx RFA) 104b amplifies the differential signal and provides it to a receiver (Rx) module 106 of a radio frequency (RF) transceiver 100 illustrated in FIG. 1 for further processing. Deactivating the active components of the radio frequency power amplifier (RFPA) 501 prevents a signal from the radio frequency power amplifier (RFPA) 501 to enter the output line 105e. Therefore, the differential signal provided as input to the receiver radio frequency amplifier (Rx RFA) 104 is not corrupted by the single-ended signal of the radio frequency power amplifier (RFPA) 105.

Similarly, the radio frequency power amplifier (RFPA) 501 is switchlessly coupled to the balun 102 by activating 605b active components of the radio frequency power amplifier (RFPA) 501 and deactivating the active components of the receiver radio frequency amplifier (Rx RFA) 104. The radio frequency power amplifier (RFPA) 501 may receive a single-ended signal from a transmitter (Tx) module 107 of the radio frequency (RF) transceiver 100. An amplified single-ended signal is provided to one of the first and second nodes 102c and 102d by the single-ended radio frequency power amplifier (RFPA) 501 through the single-ended output line 502.

The single-ended signal reaches the antenna 108. The antenna 108 transmits the amplified single-ended signal.

A method of manufacturing a radio frequency front-end circuit 101 is also disclosed herein. The method comprises integrating on a single semiconductor integrated circuit chip (not shown), a balun 102 comprising a center-tapped inductor 102a having a first node 102c, a second node 102d, and a center-tap 102b coupled to a fixed voltage. The fixed voltage is either a supply voltage $V_{DD}$ 302 or a supply ground 301, depending on the type of transistors used to realize the receiver radio frequency amplifier (Rx RFA) 104 and the radio frequency power amplifier (RFPA) 105. The method also comprises integrating on the single semiconductor chip, a receiver radio frequency amplifier (Rx RFA) 104 having balanced input lines 104c and 104d coupled to the first and second nodes 102c and 102d of the center-tapped inductor 102a. Furthermore, the method comprises integrating on the single semiconductor chip, a radio frequency power amplifier (RFPA) 105 having balanced output lines 105e and 105f coupled to the first and second nodes 102c and 102d of the center-tapped inductor 102a. The method further comprises integrating on the single semiconductor chip, a selector circuit 201 for selectively activating active components of the receiver radio frequency amplifier (Rx RFA) 104 and deactivating active components of the radio frequency power amplifier (RFPA) 105 during conversion of a single-ended signal to a differential signal. The selector circuit 201 also activates the active components of the radio frequency power amplifier (RFPA) 105 and deactivates the activating active components of the receiver radio frequency amplifier (Rx RFA) 104 for amplification of a differential signal and conversion of the amplified differential signal to a single-ended signal.

In another embodiment, the method of manufacturing a radio frequency front-end circuit 101 also comprises integrating on the single semiconductor integrated chip, one or more of a receiving module 106 coupled to outputs of the receiver radio frequency amplifier 104, a transmitter module 107 coupled to inputs of the radio frequency power amplifier 105, and a programmable logic circuit 202 for programming the selector circuit 201 for selectively operating either the receiver radio frequency amplifier 104 or the radio frequency power amplifier 105.

Furthermore, a method of manufacturing a radio frequency (RF) front-end circuit 101 comprising a radio frequency power amplifier (RFPA) 501 having a single-ended output line 502 is also described. The method comprises integrating on a single semiconductor integrated circuit chip (not shown), a balun 102 comprising a center-tapped inductor 102a having a first node 102c, a second node 102d, and a center-tap 102b coupled to a fixed voltage. The fixed voltage is either a supply voltage $V_{DD}$ 302 or a supply ground 301, depending on the type of transistors used to realize the receiver radio frequency amplifier (Rx RFA) 104 and the radio frequency power amplifier (RFPA) 501. The method also comprises integrating on the single semiconductor chip, a receiver radio frequency amplifier (Rx RFA) 104 having balanced input lines 104c and 104d coupled to the first and second nodes 102c and 102d of the center-tapped inductor 102a. Furthermore, the method comprises integrating on the single semiconductor chip, the single-ended radio frequency power amplifier 501 having the single-ended output line coupled to one of the first and second nodes 102c and 102d of the center-tapped inductor 102a. The method further comprises integrating on the single semiconductor chip, a selector circuit 201 for activating active components of the receiver radio frequency amplifier (Rx RFA) 104 and deactivating active components of the radio frequency power amplifier (RFPA) 501 during conversion of a single-ended signal to a differential signal. The selector circuit 201 also activates the active components of the radio frequency power amplifier (RFPA) 501 and deactivates the activating active components of the receiver radio frequency amplifier (Rx RFA) 104 for transmission of an amplified single-ended signal received from the radio frequency power amplifier (RFPA) 501.

Consider an exemplary application of the radio frequency front-end circuit 101 illustrated in FIGS. 3A and 3B for transmission and reception over an ISM (Industrial, Scientific and Medical) band. The ISM band is reserved internationally for the use of RF electromagnetic fields for industrial, scientific and medical purposes other than communications. For an operating frequency of 2.4 GHz of the ISM band, the design of the radio frequency front-end circuit 101 is as follows. An antenna 108 of 50 ohm impedance for receiving and transmitting signals at the 2.4 GHz operating frequency is provided. The antenna 108 is connected to the first node 102c of a center-tapped Inductor 102 having 5 nano Henry (nH) to 10 nano Henry (nH) inductance. The inductance of the center-tapped Inductor 102 varies significantly based on the overall radio frequency (RF) front-end circuit 101 topology and the performance requirements in radio frequency (RF) complementary metal-oxide-semiconductor (CMOS) requirements. Values of decoupling capacitor C1 305 and capacitor C2 102e may also vary based on the overall parasitic capacitance of the radio frequency (RF) front-end circuit 101. For this example, a decoupling capacitor C1 305 of value 4 pico Farad (pF) and a capacitor C2 102e of value 0.5 pico Farad (pF) are considered. Capacitor C3 306 and capacitor C4 307 are not required for this example.

Furthermore, as explained above, the passive network 102f may comprise a combination of passive components comprising one or more resistors, capacitors, and inductors. In this example, by using a capacitor of value 1 pico Farad (pF) in the passive network 102f, amplitudes of the complementary components of the differential signal generated at the first node 102c and the second node 102d are approximately matched to the implementation requirements of the radio frequency (RF) front-end circuit 101. Capacitor C2 102e and the capacitor in the passive network 102f are shared by both the receiver radio frequency amplifier (Rx RFA) 104 (on the source terminal sides of the transistors 104a and 104b) and the radio frequency power amplifier (RFPA) 105 (on the load terminal sides of transistors 105a and 105c), rendering a compact implementation of the radio frequency front-end circuit 101.

The p-MoSFETs 104a and 104b of the receiver radio frequency amplifier (Rx RFA) 104 are biased appropriately. The p-MoSFETs 104a and 104b are each attached to individual impedances of 100 ohm (not shown) each, to configure the impedance looking into the p-MoSFET 104a from the first node 102c to be nominally equal to 100 ohm and the impedance looking into the p-MoSFET 104b from the second node 102d to be nominally equal to 100 ohm.

The p-MoSFETs 104a and 104b are effectively switched off during the transmitting mode utilizing the switch S1 303, as described in the description of FIGS. 3A and 3B. To switch off the p-MoSFETs 104a and 104b, the gate terminals of p-MoSFETs 104a and 104b are connected to a fixed supply voltage $V_{DD}$ 302. The p-MoSFETs 104a and 104b are also switched off by providing equal voltages to the gate terminals and the source terminals of each of the p-MoSFETs 104a and 104b. The choice of switching off the p-MoSFETs 104a and 104b by either of the methods is based on the characteristics of the p-MoSFETs 104a and 104b, actual voltage swings and other performance requirements. Furthermore, depending on the requirement, additional cascode p-MOSFET devices are connected between the p-MOSFET 104a and the receiver radio frequency amplifier (Rx RFA) 104 load +RFout and between the p-MOSFET 104b and the receiver radio frequency amplifier (Rx RFA) 104 load −Rfout for reverse isolation.

Furthermore, load impedance (not shown) of the receiver radio frequency amplifier (Rx RFA) 104 is designed to provide a requisite gain greater than 20 decibel (dB). The load impedance of the receiver radio frequency amplifier (Rx RFA) 104 is typically a tuned inductive load realized using a center-tapped inductor.

The radio frequency power amplifier (RFPA) 105 nominally delivers an output power of +2 decibels milliwatt (dBm) to the 50 ohm antenna 108. The n-MoSFETs 105a, 105b and 105c, 105d are implemented as multiple fingers which can be individually selected to realize a programmable gain in the output power of the radio frequency power amplifier (RFPA) 105. Depending on the gain requirement from the power radio frequency power amplifier (RFPA) 105, one or more of the fingers i.e. the n-MoSFETs 105a, 105b and the n-MoSFETs 105c, 105d are switched off during the transmitting mode. If both the fingers, n-MoSFETs 105a, 105b and the n-MoSFETs 105c, 105d are switched on during the transmitting mode, the n-MoSFETs 105a, 105b provide the first complementary current signal Irfp of the differential signal and the n-MoSFETs 105c, 105d provide the second complementary current signal Irfn of the differential signal. The first complementary current signal Irfp and the second complementary current signal Irfn constructively add up to produce a single-ended signal which is available at the first node 102c of the center-tapped inductor 102a. The single-ended signal is then provided to the antenna 108 for transmission. Amplitude of the single-ended signal provided to the antenna 108 is nominally twice the amplitude of both the first complementary current signal Irfp and the second complementary current signal Irfn.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

I claim:

1. A radio frequency front-end circuit, comprising:
    a balun, comprising:
        a single coil center-tapped inductor having a center-tap drawn from center of the single coil, said single coil center-tapped inductor comprising a first node and a second node, said center-tap switchlessly coupled to a fixed voltage, wherein said balun is configured to receive a single-ended signal through said first node of said single coil center-tapped inductor and convert said single-ended signal to a differential signal, wherein said balun is configured to receive said differential signal through said first node and said second node and convert said differential signal to said single-ended signal, and wherein said differential signal is available at said first node and said second node, and said single-ended signal is available at said first node;
    a receiver radio frequency amplifier having balanced input lines connected to said first node and said second node, said receiver radio frequency amplifier configured for receiving and amplifying said differential signal, wherein said receiver radio frequency amplifier comprises one or more active components;
    a radio frequency power amplifier having balanced output lines connected to said first node and said second node, said radio frequency power amplifier configured for providing an amplified differential signal to said balun, wherein said radio frequency power amplifier comprises one or more active components; and
    a selector circuit in communication with said receiver radio frequency amplifier and said radio frequency power amplifier, said selector circuit configured for activating said active components of said receiver radio frequency amplifier and deactivating said active components of said radio frequency power amplifier during said conversion of said single-ended signal to said differential signal, and vice versa during said conversion of said differential signal to said single-ended signal;
    whereby said balun is switchlessly and selectively coupled to said receiver radio frequency amplifier during said conversion of said single-ended signal to said differential signal and said radio frequency power amplifier during said conversion of said differential signal to said single-ended signal.

2. The radio frequency front-end circuit of claim 1, wherein said fixed voltage is a supply ground.

3. The radio frequency front-end circuit of claim 1, wherein said fixed voltage is a supply voltage.

4. The radio frequency front-end circuit of claim 1, wherein said active components of said receiver radio frequency amplifier comprise one or more transistors, and wherein said selector circuit switches on said one or more transistors during said conversion of said single-ended signal to said differential signal.

5. The radio frequency front-end circuit of claim 1, wherein said active components of said radio frequency power amplifier comprise one or more transistors, and wherein said selector circuit switches on said one or more transistors during said conversion of said differential signal to said single-ended signal.

6. The radio frequency front-end circuit of claim 1, further comprising an antenna coupled to one of said first node and said second node of said single coil center-tapped inductor.

7. The radio frequency front-end circuit of claim 6, wherein impedance of said antenna approximately matches input impedance of said receiver radio frequency amplifier.

8. The radio frequency front-end circuit of claim 6, wherein impedance of said antenna approximately matches output impedance of said radio frequency power amplifier.

9. The radio frequency front-end circuit of claim 6, wherein impedance of said antenna is Rin and impedance of each of said balanced input lines of said receiver radio frequency amplifier is 2Rin.

10. The radio frequency front-end circuit of claim 6, wherein impedance of said antenna is $R_L$ and impedance of each of said balanced output lines of said radio frequency power amplifier is about $2R_L$.

11. The radio frequency front-end circuit of claim 1, further comprising a programmable logic circuit for programming said selector circuit for activating said active components of said receiver radio frequency amplifier and deactivating said active components of said radio frequency power amplifier during said conversion of said single-ended signal to said differential signal, and vice versa during said conversion of said differential signal to said single-ended signal.

12. A radio frequency front-end circuit, comprising:
a balun, comprising:
a single coil center-tapped inductor having a center-tap drawn from center of the single coil, said single coil center-tapped inductor comprising a first node and a second node, said center-tap switchlessly coupled to a fixed voltage, wherein said balun is configured to receive a said single-ended signal through said first node of said single coil center-tapped inductor and convert said single-ended signal to a differential signal, wherein said balun is configured to receive said differential signal through said first node and said second node and convert said differential signal to said single-ended signal, and wherein said differential signal is available at said first node and said second node, and said single-ended signal is available at said first node;
a receiver radio frequency amplifier having balanced input lines connected to said first node and said second node, said receiver radio frequency amplifier configured for receiving and amplifying said differential signal, wherein said receiver radio frequency amplifier comprises one or more active components;
a radio frequency power amplifier having a single-ended output line connected to one of said first node and said second node, said radio frequency power amplifier configured for providing an amplified single-ended signal for transmission, wherein said radio frequency power amplifier comprises one or more active components; and
a selector circuit in communication with said receiver radio frequency amplifier and said radio frequency power amplifier, said selector circuit configured for activating said active components of said receiver radio frequency amplifier and deactivating said active components of said radio frequency power amplifier during said conversion of said single-ended signal to said differential signal, and vice versa during said conversion of said differential signal to said single-ended signal;
whereby said balun is switchlessly and selectively coupled to said receiver radio frequency amplifier during said conversion of said single-ended signal to said differential signal and said radio frequency power amplifier during said conversion of said differential signal to said single-ended signal.

13. The radio frequency front-end circuit of claim 12, wherein said fixed voltage is a supply ground.

14. The radio frequency front-end circuit of claim 12, wherein said fixed voltage is a supply voltage.

15. The radio frequency front-end circuit of claim 12, further comprising an antenna coupled to one of said first node and said second node of said single coil center-tapped inductor.

16. The radio frequency front-end circuit of claim 15, wherein impedance of said antenna approximately matches input impedance of said receiver radio frequency amplifier.

17. The radio frequency front-end circuit of claim 12, further comprising a programmable logic circuit for programming said selector circuit for activating said active components of said receiver radio frequency amplifier and deactivating said active components of said radio frequency power amplifier during said conversion of said single-ended signal to said differential signal, and vice versa during said conversion of said differential signal to said single-ended signal.

18. A method of selectively accessing a balun in a radio frequency front-end circuit, comprising:
providing said balun comprising a single coil center-tapped inductor with a center-tap drawn from center of the single coil;
switchlessly coupling said center-tap of said single coil center-tapped inductor to a fixed voltage;
providing a receiver radio frequency amplifier and a radio frequency power amplifier, wherein said receiver radio frequency amplifier and said radio frequency power amplifier comprise active components;
coupling a first node and a second node of said single coil center-tapped inductor to balanced input lines of said receiver radio frequency amplifier and balanced output lines of said radio frequency power amplifier; and
switchlessly coupling one of said receiver radio frequency amplifier and said radio frequency power amplifier to said single coil center-tapped inductor of said balun by performing one of:
activating active components of said receiver radio frequency amplifier and converting a single-ended signal received at one of said first node and said second node to a differential signal, wherein said differential signal is obtained at said first node and said second node, and wherein said differential signal is provided to said balanced input lines of said receiver radio frequency amplifier; and
activating active components of said radio frequency power amplifier and constructively combining an amplified differential signal along said first node and said second node for obtaining a single-ended signal at said first node, wherein said amplified differential signal is received from said radio frequency power amplifier through said balanced output lines.

19. The method of claim 18, wherein said fixed voltage is a supply ground.

20. The method of claim 18, wherein said fixed voltage is a supply voltage.

21. The method of claim 18, wherein said step of activating active components of said receiver radio frequency amplifier comprises deactivating said active components of said radio frequency power amplifier.

22. The method of claim 18, wherein said step of activating active components of said radio frequency power amplifier comprises deactivating said active components of said receiver radio frequency amplifier.

23. A method of selectively accessing a balun in a radio frequency front-end circuit, comprising:
providing said balun comprising a single coil center-tapped inductor with a center-tap drawn from center of the single coil;
switchlessly coupling said center-tap of said single coil center-tapped inductor to a fixed voltage;
providing a receiver radio frequency amplifier and a radio frequency power amplifier, wherein said receiver radio frequency amplifier and said radio frequency power amplifier comprise active components;
coupling a first node and a second node of said single coil center-tapped inductor to balanced input lines of said receiver radio frequency amplifier;
coupling one of said first node and said second node to a single-ended output line of said radio frequency power amplifier; and switchlessly coupling one of said receiver radio frequency amplifier and said radio frequency power amplifier to said single coil center-tapped inductor of said balun by performing one of:

activating active components of said receiver radio frequency amplifier and converting a single-ended signal received at one of said first node and said second node to a differential signal, wherein said differential signal is obtained at said first node and said second node, and wherein said differential signal is provided to said balanced input lines of said receiver radio frequency amplifier; and activating active components of said radio frequency power amplifier and providing an amplified single-ended signal to one of said first node and said second node, wherein said amplified single-ended signal is received from said radio frequency power amplifier through said single-ended output line.

24. The method of claim 23, wherein said fixed voltage is a supply ground.

25. The method of claim 23, wherein said fixed voltage is a supply voltage.

26. The method of claim 23, wherein said step of activating active components of said receiver radio frequency amplifier comprises deactivating said active components of said radio frequency power amplifier.

27. The method of claim 23, wherein said step of activating active components of said radio frequency power amplifier comprises deactivating said active components of said receiver radio frequency amplifier.

28. A method of manufacturing a radio frequency front-end circuit, comprising:

integrating on a single semiconductor integrated circuit chip:
a balun comprising a single coil center-tapped inductor having a center-tap drawn from center of the single coil, said single coil center-tapped inductor comprising a first node and a second node, said center-tap coupled to a fixed voltage, wherein said single coil center-tapped inductor configured to convert between a single-ended signal and a differential signal;
a receiver radio frequency amplifier having balanced input lines coupled to said first node and said second node of said single coil center-tapped inductor;
a radio frequency power amplifier having balanced output lines coupled to said first node and said second node of said single coil center-tapped inductor; and
a selector circuit for selectively activating active components of said receiver radio frequency amplifier and deactivating active components of said radio frequency power amplifier, and vice versa.

29. The method of claim 28, wherein coupling said center-tap to said fixed voltage comprises coupling said fixed voltage to a supply ground.

30. The method of claim 28, wherein coupling said center-tap to said fixed voltage comprises coupling said fixed voltage to a supply voltage.

31. The method of claim 28, further comprising integrating on said single semiconductor integrated chip, a receiving module coupled to outputs of said receiver radio frequency amplifier.

32. The method of claim 28, further comprising integrating on said single semiconductor integrated chip, a transmitter module coupled to inputs of said radio frequency power amplifier.

33. The method of claim 28, further comprising integrating on said single semiconductor integrated chip, a programmable logic circuit for programming said selector circuit to selectively operate one of said receiver radio frequency amplifier and said radio frequency power amplifier.

34. A method of manufacturing a radio frequency front-end circuit, comprising:

integrating on a single semiconductor integrated circuit chip:
a balun comprising a single coil center-tapped inductor having a center-tap drawn from center of the single coil, said single coil center-tapped inductor comprising a first node and a second node, said center-tap coupled to a supply voltage, wherein said single coil center-tapped inductor configured to convert between a single-ended signal and a differential signal;
a receiver radio frequency amplifier having balanced input lines coupled to said first node and said second node of said single coil center-tapped inductor; a radio frequency power amplifier having a single-ended output line coupled to said first node of said single coil center-tapped inductor; and
a selector circuit for selectively activating active components of said receiver radio frequency amplifier and deactivating active components of said radio frequency power amplifier, and vice versa.

35. The method of claim 34, wherein coupling said center-tap to said fixed voltage comprises coupling said fixed voltage to a supply ground.

36. The method of claim 34, wherein coupling said center-tap to said fixed voltage comprises coupling said fixed voltage to a supply voltage.

37. The method of claim 34, further comprising integrating on said single semiconductor integrated chip, a programmable logic circuit for programming said selector circuit to selectively operate one of said receiver radio frequency amplifier and said radio frequency power amplifier.

* * * * *